(12) United States Patent
Yamada et al.

(10) Patent No.: US 11,631,789 B2
(45) Date of Patent: *Apr. 18, 2023

(54) LIGHT EMITTING DEVICE

(71) Applicant: NICHIA CORPORATION, Anan (JP)

(72) Inventors: Yuichi Yamada, Anan (JP); Motokazu Yamada, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/485,506

(22) Filed: Sep. 27, 2021

(65) Prior Publication Data

US 2022/0013694 A1   Jan. 13, 2022

Related U.S. Application Data

(63) Continuation of application No. 16/727,923, filed on Dec. 27, 2019, now Pat. No. 11,139,418, which is a
(Continued)

(30) Foreign Application Priority Data

Dec. 22, 2015 (JP) .................................. 2015-249237

(51) Int. Cl.
*H01L 33/46* (2010.01)
*H01L 33/48* (2010.01)
(Continued)

(52) U.S. Cl.
CPC ............ *H01L 33/46* (2013.01); *H01L 33/486* (2013.01); *H01L 33/505* (2013.01); *H01L 33/58* (2013.01);
(Continued)

(58) Field of Classification Search
CPC ..... H01L 33/46; H01L 33/486; H01L 33/505; H01L 33/58; H01L 33/62
See application file for complete search history.

(56) References Cited

U.S. PATENT DOCUMENTS 9,484,510 B2   11/2016   Kim
10,090,441 B2 *  10/2018   Yamada .................. H01L 33/62
(Continued)

FOREIGN PATENT DOCUMENTS

JP   2001-257381   9/2001
JP   2005-135224   5/2005
(Continued)

OTHER PUBLICATIONS

Office Action with Form PTO-892 Notice of References Cited issued by the U.S. Patent and Trademark Office for the U.S. Appl. No. 15/387,649, dated Aug. 25, 2017.
(Continued)

*Primary Examiner* — Mark W Tornow
(74) *Attorney, Agent, or Firm* — Mori & Ward, LLP

(57) ABSTRACT

A light emitting device includes a base including a support having a support surface. A light emitting element includes a semiconductor layer and a sapphire substrate provided on the semiconductor layer opposite to the support surface. A reflecting film provided on the sapphire substrate. A light-transmissive covering member is provided on the support surface. A height of the light-transmissive covering member viewed in a direction in which a width of the light-transmissive covering member appears smallest is 0.5 times or less of the width of the light-transmissive covering member. A light reflecting layer is provided on a first region of the base such that a first reflectivity in the first region of the base being higher than a second reflectivity in a second region of the base, the second region overlapping with the light emitting element and being surrounded by the first region as viewed in the height direction.

8 Claims, 6 Drawing Sheets

Related U.S. Application Data continuation of application No. 16/111,239, filed on Aug. 24, 2018, now Pat. No. 10,553,763, which is a continuation of application No. 15/387,649, filed on Dec. 22, 2016, now Pat. No. 10,090,441.

(51) Int. Cl.
*H01L 33/50* (2010.01)
*H01L 33/58* (2010.01)
*H01L 33/62* (2010.01)
*H01L 33/54* (2010.01)
*H01L 33/60* (2010.01)

(52) U.S. Cl.
CPC .............. *H01L 33/62* (2013.01); *H01L 33/54* (2013.01); *H01L 33/60* (2013.01); *H01L 2224/16225* (2013.01); *H01L 2224/73204* (2013.01)

(56) References Cited

U.S. PATENT DOCUMENTS

| | | | |
|---|---|---|---|
| 10,553,763 B2 * | 2/2020 | Yamada | H01L 33/58 |
| 11,139,418 B2 * | 10/2021 | Yamada | H01L 33/505 |
| 2004/0070337 A1 | 4/2004 | Goh et al. | |
| 2004/0188700 A1 | 9/2004 | Fukasawa et al. | |
| 2007/0138494 A1 | 6/2007 | Pugh et al. | |
| 2009/0141492 A1 | 6/2009 | Fujino et al. | |
| 2010/0259706 A1 | 10/2010 | Kuwaharada et al. | |
| 2013/0015487 A1 | 1/2013 | Okuno | |
| 2013/0121000 A1 | 5/2013 | Lee et al. | |
| 2014/0042897 A1 | 2/2014 | Kamada | |
| 2014/0043831 A1 | 2/2014 | Yoon et al. | |
| 2014/0264412 A1 | 9/2014 | Yoon et al. | |
| 2014/0376219 A1 | 12/2014 | Ono et al. | |
| 2015/0001564 A1 | 1/2015 | Oguro et al. | |
| 2015/0219966 A1 | 8/2015 | Song et al. | |
| 2016/0111599 A1 | 4/2016 | Ohya et al. | |
| 2016/0149076 A1 | 5/2016 | Kitano et al. | |

FOREIGN PATENT DOCUMENTS

| | | |
|---|---|---|
| JP | 2006-114863 | 4/2006 |
| JP | 2007-201171 | 8/2007 |
| JP | 2007-243225 | 9/2007 |
| JP | 2007-243226 | 9/2007 |
| JP | 2007-311401 | 11/2007 |
| JP | 2010-232252 | 10/2010 |
| JP | 2011-040715 | 2/2011 |
| JP | 2011-211074 | 10/2011 |
| JP | 2012-510716 | 5/2012 |
| JP | 2012-216763 | 11/2012 |
| JP | 2012-244070 | 12/2012 |
| JP | 2013-106047 | 5/2013 |
| JP | 2014-003096 | 1/2014 |
| JP | 5435523 B1 | 3/2014 |
| JP | 5553292 B1 | 7/2014 |
| JP | 2015-012206 | 1/2015 |
| JP | 2015-029118 | 2/2015 |
| JP | 2015-87552 | 5/2015 |
| JP | 2015-095488 | 5/2015 |
| JP | 2015-149472 | 8/2015 |
| WO | WO 2009/157166 | 12/2009 |
| WO | WO 2010/064177 | 6/2010 |
| WO | WO 2011/135667 | 11/2011 |
| WO | WO 2015/112680 | 7/2015 |

OTHER PUBLICATIONS

Office Action with Form PTO-892 Notice of References Cited issued by the U.S. Patent and Trademark Office for the U.S. Appl. No. 15/387,649, dated Dec. 19, 2017.
Advisory Action issued by the U.S. Patent and Trademark Office for the U.S. Appl. No. 15/387,649, dated Mar. 29, 2018.
Notice of Allowance issued by the U.S. Patent and Trademark Office for the U.S. Appl. No. 15/387,649, dated May 25, 2018.
Office Action with Form PTO-892 Notice of References Cited issued by the U.S. Patent and Trademark Office for the U.S. Appl. No. 16/111,239, dated Jun. 13, 2019.
Notice of Allowance issued by the U.S. Patent and Trademark Office for the U.S. Appl. No. 16/111,239, dated Sep. 30, 2019.
Office Action with Form PTO-892 Notice of References Cited issued by the U.S. Patent and Trademark Office for the parent U.S. Appl. No. 16/727,923, dated Sep. 21, 2020.
Notice of Allowance issued by the U.S. Patent and Trademark Office for the parent U.S. Appl. No. 16/727,923, dated Jan. 22, 2021.
Notice of Allowance issued by the U.S. Patent and Trademark Office for the parent U.S. Appl. No. 16/727,923, dated Jun. 2, 2021.

* cited by examiner

LIGHT EMITTING DEVICE

CROSS-REFERENCE TO RELATED APPLICATIONS

The present application is a continuation application of the U.S. patent application Ser. No. 16/727,923, filed Dec. 27, 2019, which is a continuation application of the U.S. patent application Ser. No. 16/111,239, filed Aug. 24, 2018, which issued as U.S. Pat. No. 10,553,763, which is a continuation application of the U.S. patent application Ser. No. 15/387,649, filed Dec. 22, 2016, which issued as U.S. Pat. No. 10,090,441, which claims priority under 35 U.S.C. § 119 to Japanese Patent Application No. 2015-249237, filed Dec. 22, 2015. The contents of these applications are incorporated herein by reference in their entirety.

BACKGROUND OF THE INVENTION

Field of the Invention

The present invention relates to a light emitting device.

Discussion of the Background

In recent years, various electronic components have been proposed and put into practical use, and high performance has been required of these electronic components. For example, in backlights used for liquid crystal televisions, general lighting devices, and the like, well-shaped light emitting devices are appreciated due to a demand of reduction in thickness, so that reduction in size of a light emitting device itself is highly demanded.

For example, Japanese Unexamined Patent Application Publication No. 2006-114863 discloses a light emitting device that realizes batwing light distribution characteristics by combining a secondary optical lens with an LED and enables reduction in thickness of equipment by uniformly diffusing light in a short irradiation distance.

SUMMARY OF THE INVENTION

According to one aspect of the present invention, a light emitting device includes a base, a light emitting element, a reflecting film, a light-transmissive covering member, and a light reflecting layer. The base includes a support having a support surface, and a conductive wiring provided on the support surface. The light emitting element is mounted on the conductive wiring and the support surface to be electrically connected to the conductive wiring. The light emitting element includes a semiconductor layer and a sapphire substrate. The semiconductor layer is provided on the conductive wiring and the support surface. The sapphire substrate is provided on the semiconductor layer opposite to the support surface. The reflecting film is provided on the sapphire substrate to sandwich the sapphire substrate between the semiconductor layer and the reflecting film. The light-transmissive covering member is provided on the support surface to cover the light emitting element. A height of the light-transmissive covering member viewed in a direction in which a width of the light-transmissive covering member appears smallest is 0.5 times or less of the width of the light-transmissive covering member. The light reflecting layer is provided on a first region of the base such that a first reflectivity in the first region of the base being higher than a second reflectivity in a second region of the base, the second region overlapping with the light emitting element and being surrounded by the first region as viewed in the height direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
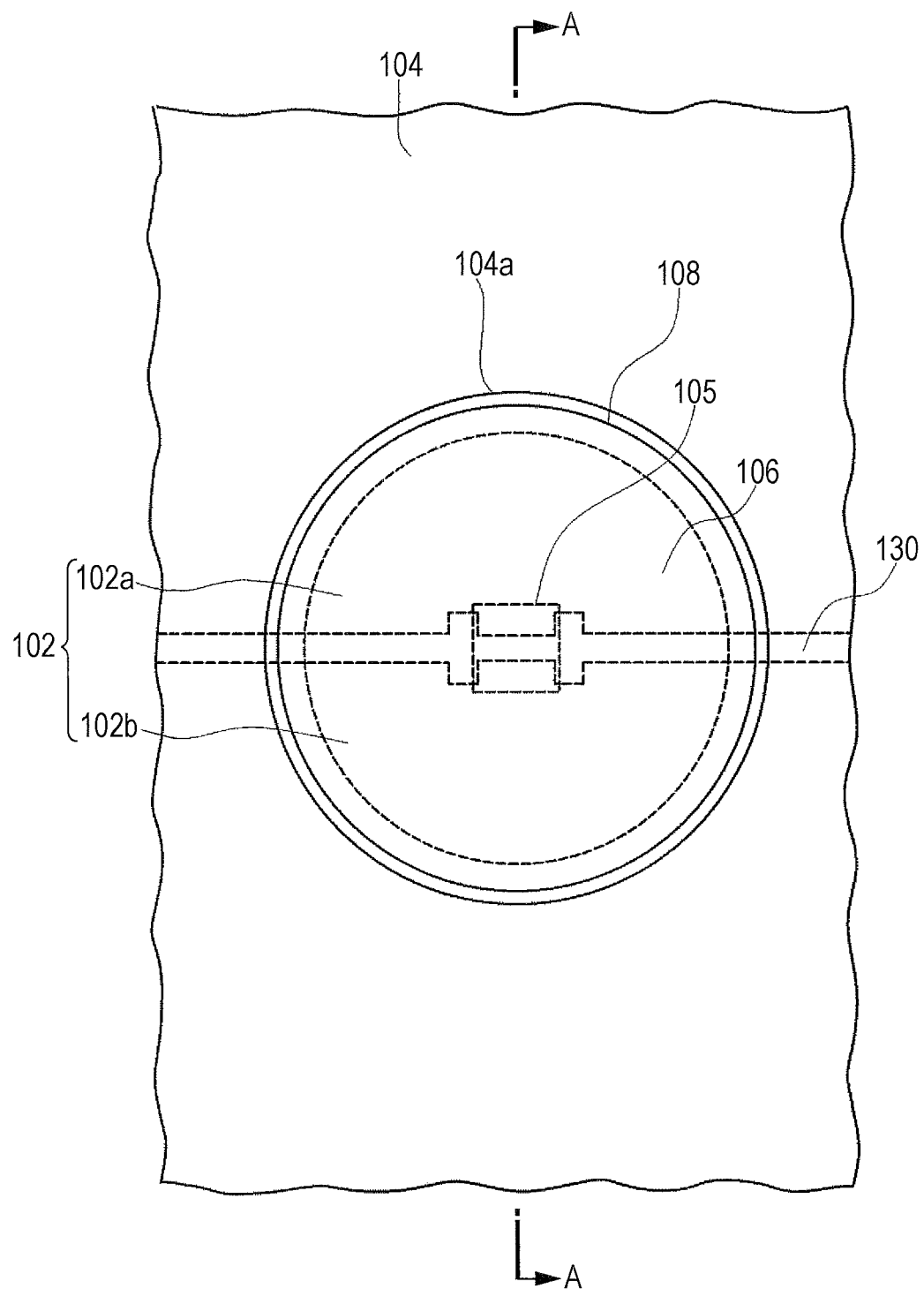
FIG. 1 is a schematic top view illustrating a part of a light emitting device according to a first embodiment.

The embodiments will now be described with reference to the accompanying drawings, wherein like reference numerals designate corresponding or identical elements throughout the various drawings.

Hereinafter, best modes and detailed descriptions for practicing the present invention are described in detail with reference to drawings. The modes indicated below, however, are examples of the light emitting device for embodying technical ideas, and the embodiments of present invention is not limited to the ones described below.

First Embodiment

Figure 2:
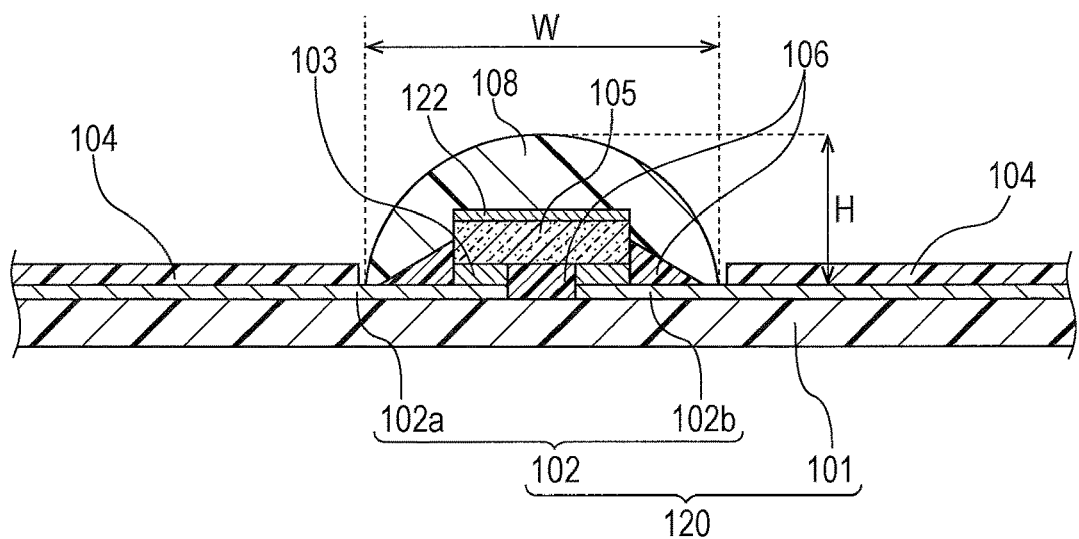
FIG. 2 is a schematic sectional view taken along the line A-A in FIG. 1.
Figure 3:
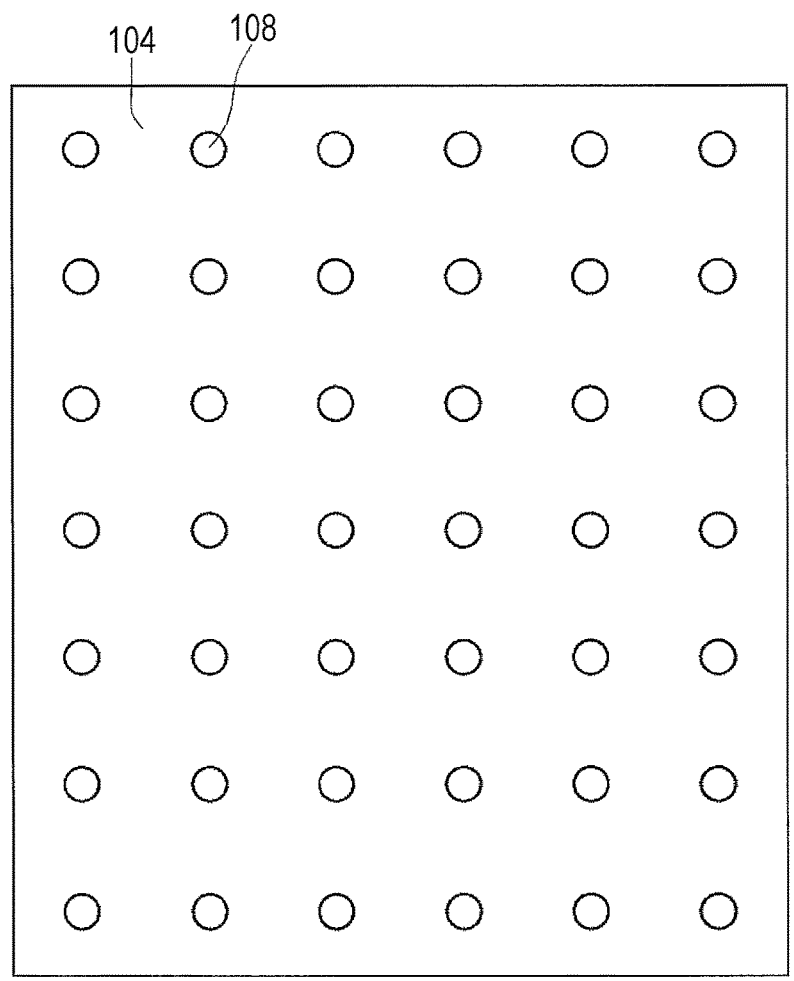
FIG. 3 is a schematic top view illustrating an example of the whole structure of the light emitting device of the first embodiment.

As illustrated in FIGS. 1, 2, and 3, a light emitting device according to a first embodiment mainly includes a base 120 having a support member 101 and a conductive wiring 102 formed on the support member 101; a light emitting element 105 mounted on the base 120 and electrically connected to the conductive wiring 102; and a light-transmissive covering member 108 covering the light emitting element 105 and a part of the base 120.

FIG. 2 is a schematic sectional view taken along the line A-A in FIG. 1. As illustrated in FIG. 2, the light emitting element 105 includes a reflecting film 122 on an upper surface of the light emitting element. Among the surfaces of the light emitting element 105, the upper surface of the light emitting element 105 refers to a surface disposed on a base 120 side, and hereinafter also referred to as a "first surface". A surface opposite to the first surface hereinafter referred to as a "second surface". The light emitting element 105 includes a plurality of lateral surfaces between the first surface and the second surface.

The base 120 includes the support member 101 made of an insulating member and the conductive wiring 102 formed on a surface of the support member 101. As illustrated in FIG. 2, the light emitting element 105 is flip-chip mounted so as to straddle a pair of positive and negative conductive wirings 102*a* and 102*b* provided on an upper surface of the support member 101 with a bonding member 103 interposed between the light emitting element and the pair of conductive wirings. An underfill material 106 may be disposed in a gap between a lower surface of the light emitting element 105 and an upper surface of the base 120, or on a lateral surface of the light emitting element 105.

A light reflecting layer 104 made of an insulating member is formed in a region of the conductive wiring 102 which does not require electrical connection.

The covering member 108 can be a light-transmissive member and can be provided on an upper surface of the base 120 so as to cover the light emitting element 105. The covering member 108 may be in direct contact with the base 120. The viscosity of the covering member 108 is adjusted so as to enable printing or dispenser coating, and the covering member can be cured by heating or light irradiation. The covering member 108 may be formed into, for example, a substantially hemispherical shape, a vertically long protrusion shape in a sectional view, and a circular shape or an elliptical shape in a top view.

On the upper surface of the base 120, the average reflectivity in a region not covered with the covering member 108 (i.e., an uncovered region) is set higher than the average reflectivity in a region covered with the covering member 108 (i.e., a covered region). Generally, the vicinity of the light emitting element 105 is covered with a reflecting layer in order to efficiently extract the light from the light emitting element 105. The light reflected in the vicinity of the light emitting element, however, is extracted from directly above the light emitting element 105, therefore the luminance is increased in a place where the luminance is desired be decreased to obtain uniform light emission.

Therefore, in the present embodiment, the average reflectivity for the light emission peak wavelength of the light emitting element in the region of the base covered with the covering member 108 is set lower than the average reflectivity for the light emission peak wavelength of the light emitting element in the region positioned outside the covering member, in order to decrease the quantity of light reflected in a boundary surface between a bottom surface of the covering member and the upper surface of the base. Thereby, an influence of diffusing reflection of light in the covering member 108 can be decreased to reduce light that passes through the covering member upwardly.

The term "average reflectivity" in the present specification refers to a value obtained by averaging the reflectivities of members in a region, whose reflectivity is desired to be measured, in consideration of the ratio of the areas of the members.

For example, the reflectivity of a groove 130 (see FIG. 1) between the pair of conductive wirings 102*a* and 102*b* may be set higher than the reflectivity of the upper surface of the conductive wiring 102.

The reflectivity can be measured by a spectral reflectivity measuring device. Although reflectivity measurement may be conducted for a sample whose shape is different from the shape of a product or component that is actually used, the measurement is to be conducted for a sample which has a thickness and a layer structure equal to the product that is actually used, when the thickness and the layer structure involve a change in the reflectivity.

Used in the present embodiment is a blue light emitting element having a light emission peak wavelength of 430 to 460 nm, and an upper surface of the conductive wiring 102 to be a bonding surface between the covering member 108 and the conductive wiring is formed of Cu so that the reflectivity is decreased in the region covered with the covering member 108. As illustrated in FIG. 1, an opening 104*a* of the light reflecting layer is preferably positioned outside the covering member 108. In the present specification, the reflectivity refers to a reflectivity for the light emission peak wavelength of a light emitting element used unless otherwise particularly specified. When a wavelength conversion member described later is used, the light emission wavelength of a light emitting element and the light emission wavelength of the wavelength conversion member may be considered. This case is described in a second embodiment described later.

The average reflectivity in the region of the base covered with the covering member 108 is, for example, preferably 60% or less, more preferably 50% or less, further preferably 40% or less. On the other hand, the average reflectivity in the region of the base not covered with the covering member 108 is preferably 70% or more. Thereby, in a region which is away from the light emitting element 105, the reflectivity can be made higher to give a light emitting device in which luminance non-uniformity is improved.

Here, the difference between the average reflectivity in the region of the base covered with the covering member 108 and the average reflectivity in the region of the base not covered with the covering member 108 is preferably 20% or more, more preferably 25% or more. Thereby, luminance unevenness can be improved.

The reflecting film formed on the second surface of the light emitting element 105 may be a metal film or a dielectric multilayer film, for example, distributed Bragg reflector (DBR) film. Thereby, light directed above the light emitting element 105 is reflected by the reflecting film 122 so that the quantity of light directly above the light emitting element 105 can be reduced to provide batwing light distribution characteristics. The reflecting film can be directly formed on the light emitting element 105, making a batwing lens unnecessary to reduce the thickness of the light emitting device.

The reflecting film 122 preferably has reflectivity dependent on incident angle of the emission wavelength of light from the light emitting element 105. Specifically, the reflectivity of the reflecting film 122 is set to be lower for obliquely incident emission wavelength than for perpendicularly incident emission wavelength. Accordingly, the change in luminance directly above the light emitting element can be moderated, thereby reducing occurrence of extreme darkness in a part directly above the light emitting element, i.e., a scotoma, for example.

Exemplification of Whole Configuration of Light Emitting Device

In the light emitting device according to the present embodiment, a plurality of covering members 108 may be arranged in a matrix form, each covering the light emitting element, as exemplified in FIG. 3. The number and the arrangement of the light emitting elements used can be appropriately selected according to the purpose and the application of the light emitting device. Most of the region exposed from the covering member 108 is covered with the light reflecting layer 104.

For example, a wavelength conversion plate and a diffusing plate that are in a form of a sheet or the like can be disposed above the light emitting device configured as described above to produce a white light source of backlight. Wavelength-converted light enters the light reflecting layer 104, and therefore, it is preferable that the light reflecting layer 104 have a high reflectivity not only for the light emission peak wavelength of the light emitting element but also for the light emission wavelength of the wavelength-converted light.

According to the present embodiment, the light distribution characteristics of the light extracted from the light emitting element 105 can be made into an ideal form, thereby improving luminance non-uniformity when the light emitting device is used as a light source for a backlight.

Second Embodiment

Figure 4:
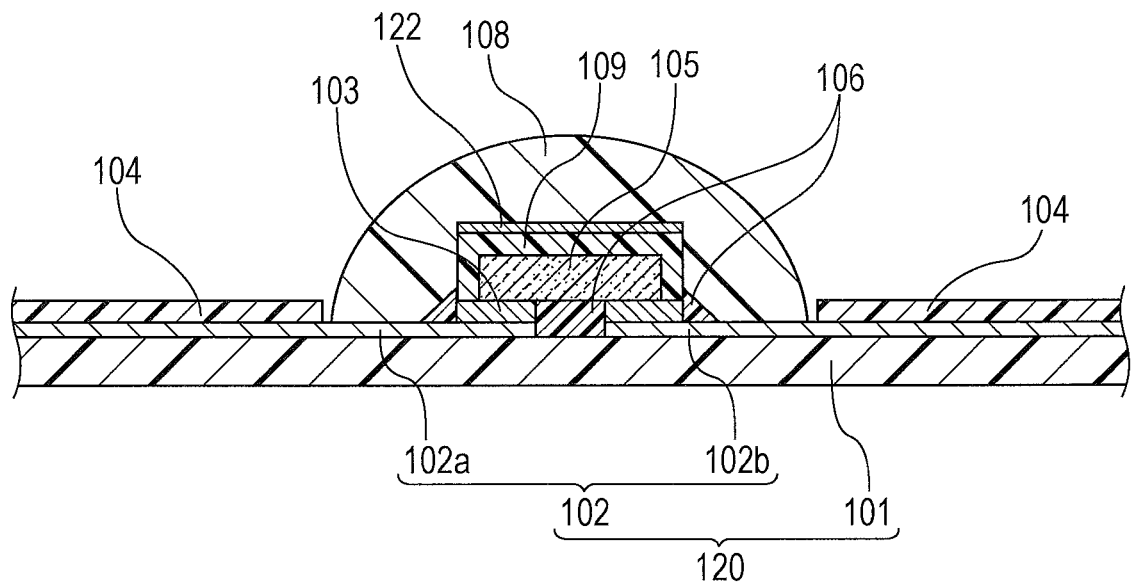
FIG. 4 is a schematic sectional view illustrating a part of a light emitting device according to a second embodiment.

FIG. 4 illustrates a schematic sectional view of a light emitting device according to a second embodiment.

The light emitting device of the present embodiment is different from the light emitting device of the first embodiment in that a wavelength conversion layer 109 is disposed between the light emitting element 105 and the reflecting film 122 as illustrated in FIG. 4. Except the difference, the light emitting device of the present embodiment can be configured in the same manner as in the first embodiment.

A part of the light emitted from the light emitting element 105 is wavelength-converted by the wavelength conversion layer 109. Further, light directed above the light emitting element 105 is reflected by the reflecting film 122, so that the quantity of light directly above the light emitting element 105 can be reduced to provide batwing light distribution characteristics. The wavelength conversion layer 109 covers the second surface and the plurality of lateral surfaces of the light emitting element 105 as illustrated in FIG. 4. The wavelength conversion layer 109 includes the reflecting film 122 on an upper surface of the wavelength conversion layer.

Also in the present embodiment, the reflectivity for the light emission peak wavelength of the light emitting element can be set in the same manner as in the first embodiment in consideration of light whose wavelength is not converted, to reduce light extracted from directly above the light emitting element.

Further, the reflectivity for the peak wavelength of light whose wavelength is converted is also preferably set in the same manner in consideration of light whose wavelength is converted. That is, the average reflectivity for the light emission peak wavelength of a wavelength conversion member in the region of the base not covered with the covering member is preferably set higher than the average reflectivity for the light emission peak wavelength of a wavelength conversion member in the region of the base covered with the covering member.

The wavelength conversion layer 109 is sufficient as long as it is, for example, one that absorbs the light from the light emitting element including a nitride semiconductor as a light emitting layer, and converts the wavelength of the light into light having a different wavelength. For example, a fluorescent substance-containing resin material can be suitably used.

The light emitting device of the second embodiment, which is configured as described above, can provide a white light source that enables a short optical distance to an irradiation surface.

Third Embodiment

Figure 5:
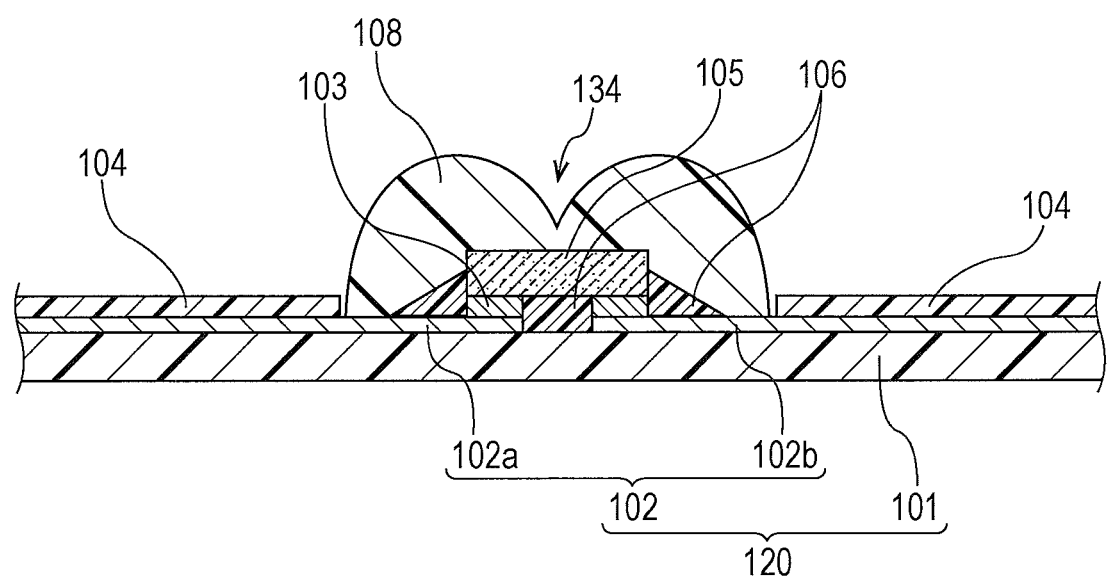
FIG. 5 is a schematic sectional view illustrating a part of a light emitting device according to a third embodiment.

FIG. 5 illustrates a schematic sectional view of a light emitting device according to a third embodiment.

The light emitting device of the present embodiment is different from the light emitting device of the first embodiment in that the light emitting element 105 has Lambertian light distribution characteristics, and a central portion on the upper surface of the covering member 108 is depressed in order to allow the light emitted from the light emitting element 105 to exhibit batwing light distribution characteristics. In the first embodiment, the reflecting film 122 is formed on the second surface of the light emitting element 105. In the present embodiment, however, the reflecting film does not exist, and the covering member 108 includes a depression 134 in a portion directly above the light emitting element 105 on a second surface side of the light emitting element. Regarding the other configuration, the light emitting device of the present embodiment can be configured in the same manner as the light emitting device of the first embodiment.

In the light emitting device of the third embodiment configured as described above, the covering member 108 includes the depression 134 on the upper surface of the covering member to become a so-called batwing lens. The batwing lens can decrease the light intensity in a lateral surface direction, for example, at a light distribution angle of 80° or more by controlling the shape of the lens, because the batwing lens controls the light distribution characteristics by the entire reflection and refraction of the light emitted from the upper surface of the light emitting element, and the shape of the lens dominantly affects the quantity of light output to a lateral surface direction as compared with the lens not having the depression 134, which is used together with the light emitting element having the reflecting film and batwing light distribution.

Fourth Embodiment

Figure 6:
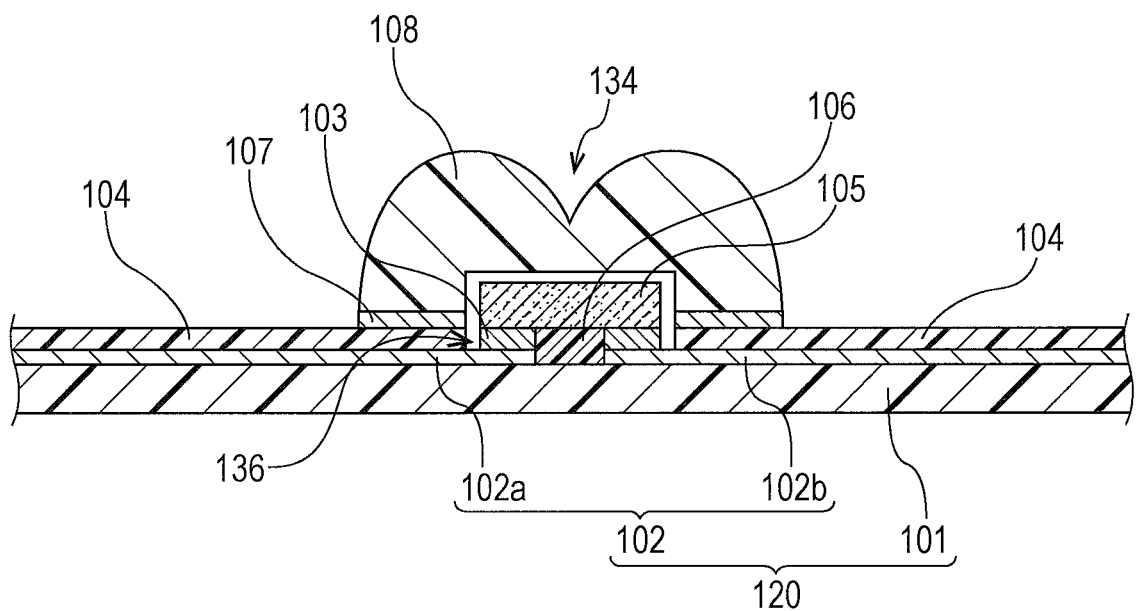
FIG. 6 is a schematic sectional view illustrating a part of a light emitting device according to a fourth embodiment.

FIG. 6 illustrates a schematic sectional view of a light emitting device according to a fourth embodiment.

The light emitting device of the present embodiment is different from the light emitting device of the third embodiment in that as illustrated in FIG. 6, a light absorbing member 107 is disposed on a bottom surface of the covering member 108 except an recess portion 136 provided to house the light emitting element 105 in a lower surface central portion of the covering member (i.e., a surface that is outside the recess portion 136 and is opposite to the upper surface of the base 120), and the covering member is overlaid over the light emitting element 105 as a secondary lens. Regarding the other configuration, the light emitting device of the present embodiment can be configured in the same manner as in the third embodiment. This secondary lens is a so-called batwing lens.

The recess portion 136 is formed larger than the light emitting element 105 to house the light emitting element 105. The light emitting element 105 may be in direct contact with the covering member 108, and may be in contact with the covering member 108 with a bonding member such as a resin interposed between the light emitting element and the covering member. Alternatively, the light emitting element 105 may be in no contact with the covering member 108.

The light absorbing member 107 can be formed on the bottom surface of the covering member 108 by, for example, coating the bottom surface with a light absorbing member described later.

The reflectivity of the light absorbing member 107 is preferably 50% or less, more preferably 40% or less for the light emission peak wavelength of the light emitting element. When a material that absorbs only light in a certain wavelength range is used as the light absorbing member, it is also possible to selectively reflect light in the other wavelength ranges. The light absorbing member 107 is preferably disposed lower than the light emitting element 105. This is to decrease the quantity of light that enters the light absorbing member 107 after being emitted from the light emitting element. An inorganic material is preferably used for the light absorbing member to prevent deterioration caused by light. Specifically, there can be suitably used carbon black, triiron tetraoxide, titanium black, or the like.

The light emitting device of the fourth embodiment, which is configured as described above, can absorb reflected light in the secondary lens at the bottom surface to reduce concentration and scattering of the reflected light.

Fifth Embodiment

Figure 7:
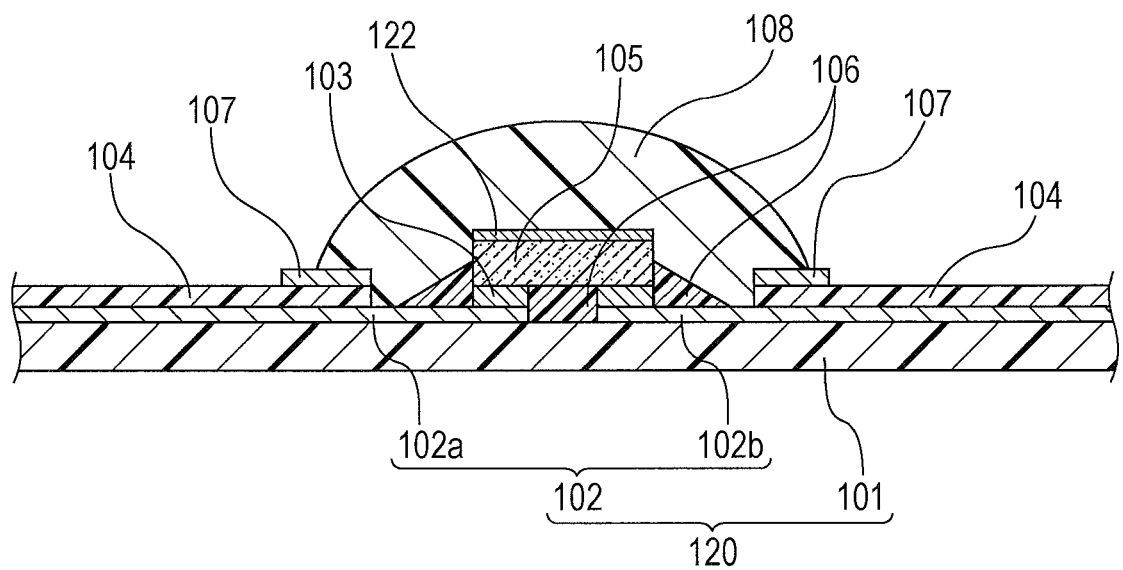
FIG. 7 is a schematic sectional view illustrating a part of a light emitting device according to a fifth embodiment.

FIG. 7 illustrates a schematic sectional view of a light emitting device according to a fifth embodiment.

In the present embodiment, the light reflecting layer 104 and the light absorbing member 107 are stacked between the upper surface of the base and the lower surface of the covering member, and the light absorbing member 107 is formed in a circular ring in a top view at a contact area between the outer edge of the covering member 108 and the upper surface of the base 120, as illustrated in FIG. 7. For example, as illustrated in FIG. 7, the light absorbing member 107 is formed so that an inner end thereof is disposed within the covering member 108, and an outer end thereof is positioned outside the covering member 108. Regarding the other configuration, the light emitting device of the present embodiment can be configured in the same manner as the light emitting device of the first embodiment.

The present embodiment can also give the same effects as in the first embodiment.

In the present embodiment, the conductive wiring on lateral sides of the light emitting element 105 can be covered with an insulating material to reduce a failure risk of the light emitting element 105 caused by, for example, static electricity.

Hereinafter, each of the embodiments is described in terms of materials and the like suitable for the constituent members of the light emitting device.

Base 120

The base 120 is a member on which the light emitting element 105 is mounted, and includes, as illustrated in each of the drawings, the conductive wiring 102 for supplying power to the light emitting element 105, and the support member 101 on which the conductive wiring 102 is disposed and which insulates and separates the conductive wiring.

Support Member 101

Examples of the material for the support member 101 include ceramics and resins such as a phenol resin, an epoxy resin, a polyimide resin, a BT resin, polyphthalamide (PPA), and polyethylene terephthalate (PET). Especially, these resins are preferably selected for the material of the support member from the view point of low costs and easy molding. The thickness of the support member can be appropriately selected, and the support member may be either a flexible substrate that can be produced by a roll-to-roll process, or a rigid substrate. The rigid substrate may be a bendable thin rigid substrate. Alternatively, ceramics is preferably selected for the material of the support member 101 in order to produce a light emitting device excellent in heat resistance and light resistance.

Examples of ceramics include alumina, mullite, forsterite, glass ceramics, nitrides (e.g., AlN), carbides (e.g., SiC), and low temperature co-fired ceramics (LTCC).

When a resin is used for the material that constitutes the support member 101, a glass fiber or another inorganic filler such as $SiO_2$, $TiO_2$, or $Al_2O_3$ can be mixed in the resin to, for example, improve the mechanical strength, decrease the coefficient of thermal expansion, and improve the light reflectivity. The support member 101 is sufficient as long as it can insulate and separate the pair of conductive wirings 102, and a so-called metal substrate obtained by forming an insulating layer on a metal member may also be used.

Conductive Wiring 102

The conductive wiring 102 is a member that is electrically connected to an electrode of the light emitting element 105 and that supplies an electric current (power) from the outside. That is, the conductive wiring functions as an electrode for power distribution from the outside, or a part of the electrode. Generally, the conductive wiring is formed in at least two (positive and negative) electrodes spaced apart from each other (e.g., 102a and 102b as illustrated in FIGS. 1 and 2).

The conductive wiring 102 is formed on at least an upper surface of the base serving as a mounting surface for the light emitting element 105. The material for the conductive wiring 102 can be appropriately selected according to, for example, the material used for the support member 101 and the production method. For example, when ceramics is used for the material of the support member 101, the material for the conductive wiring 102 is preferably a material having a high melting temperature, which can be resistant to the firing temperature of a ceramic sheet, and high melting temperature metals such as tungsten and molybdenum are preferably used. Further, the metal may be covered with one or more other metal materials such as nickel, gold, or silver by, for example, plating, sputtering, or vapor deposition.

When a glass epoxy resin is used for the material of the support member 101, the material for the conductive wiring 102 is preferably a readily processable material. The conductive wiring 102 can be formed on one surface or both surfaces of the support member by a method such as vapor deposition, sputtering or plating. A metal foil may be attached by pressing. A wiring portion can be masked by, for example, a printing method or photolithography and patterned into a predetermined shape by an etching process.

The material for the outermost surface of the conductive wiring 102 is preferably selected with respect to the emission wavelength of light from the light emitting element 105 used, in order to adjust the average reflectivity in the region covered with the covering member.

For example, Cu or Au is preferably selected with respect to light having a light emission peak wavelength of in a range of about 420 nm to about 500 nm.

Bonding Member 103

The bonding member 103 is a member that fixes the light emitting element 105 to the support member 101 or the conductive wiring 102. Examples of the bonding member include an insulating resin and an electrically conductive member. In the case of flip-chip mounting as illustrated in FIG. 2, an electrically conductive member is used. Specific examples of the electrically conductive member include an Au-containing alloy, an Ag-containing alloy, a Pd-containing alloy, an In-containing alloy, a Pb—Pd-containing alloy, an Au—Ga-containing alloy, an Au—Sn-containing alloy, a Sn-containing alloy, a Sn—Cu-containing alloy, an Sn—Cu—Ag-containing alloy, an Au—Ge-containing alloy, an Au—Si-containing alloy, an Al-containing alloy, a Cu—In-containing alloy, and a mixture of a metal and flux.

For the bonding member 103, a liquid, paste, or solid (sheet-shaped, block-shaped, powdery, or wire-shaped) member can be used. The state of the member can be appropriately selected according to, for example, the composition of the member and the shape of the base. The bonding member 103 may be formed of a single member or a plurality of members in combination. When the bonding member does not serve for, together with fixation, electrical connection to the conductive wiring 102, wire, apart from fixation, may be used to electrically connect an electrode of the light emitting element 105 to the conductive wiring 102.

Light Reflecting Layer 104

The conductive wiring 102 is preferably covered with the light reflecting layer 104 except a part which electrically connects to the light emitting element 105 or other components. That is, as illustrated in FIG. 2, a resist may be disposed on the base 120 to insulatively cover the conductive wiring 102, and the light reflecting layer 104 can be functioned as the resist. By adding a white-based filler in a resin material described later, the light emitting device can be less likely to cause leakage and absorption of light, thereby improving the light extraction efficiency.

The resin material in which the white-based filler is contained is sufficient as long as it is a material that is less likely to absorb the light from the light emitting element and is insulative. There can be used, for example, epoxy resin, silicone resin, modified silicone resin, a urethane resin, an oxetane resin, acrylic resin, polycarbonate resin, and a polyimide resin. These may be used alone or in combination. Examples of the white-based filler include oxides such as $SiO_2$, $Al_2O_3$, $Al(OH)_3$, $MgCO_3$, $TiO_2$, $ZrO_2$, $ZnO_2$, $Nb_2O_5$, MgO, $Mg(OH)_2$, SrO, $In_2O_3$, $TaO_2$, HfO, SeO, and $Y_2O_3$; nitrides such as SiN, MN, and AlON; and fluorides such as $MgF_2$. These may be used alone or in mixture.

Light Emitting Element 105

For the light emitting element 105, a publicly known one can be used. For example, a light emitting diode is preferably used as the light emitting element 105.

A wavelength of the light emitting element 105 can be appropriately selected. For example, one including a nitride semiconductor ($In_xAl_yGa_{1-x-y}N$, $0 \leq X$, $0 \leq Y$, $X+Y \leq 1$) can be used as a blue or green light emitting element. For example, GaAlAs and AlInGap can be used as a red light emitting element. Further, a semiconductor light emitting element can also be used, which is made of a material other than the materials described above. The composition, the emission color, the size, the number, and the like of the light emitting element used can be appropriately selected according to the purpose.

When the light emitting device includes a wavelength conversion material, preferable examples of the light emitting element include a nitride semiconductor ($In_xAl_yGa_{1-x-y}N$, $0 \leq X$, $0 \leq Y$, $X+Y \leq 1$) which can emit short-wavelength light capable of efficiently exciting the wavelength conversion material. The emission wavelength can be variously selected by the material for a semiconductor layer and the mixed crystallinity of the material. The light emitting element may include positive and negative electrodes on the same surface side, or may include positive and negative electrodes on difference surfaces.

The light emitting elements of the present embodiments include a substrate and a semiconductor layer stacked on the substrate. This semiconductor layer includes an n-side semiconductor layer, an active layer, and a p-side semiconductor layer formed in this order. The n-side semiconductor layer has an n-electrode formed therein, and the p-side semiconductor layer has a p-electrode formed therein. The substrate in the present embodiments is a sapphire substrate that has a reflecting mirror made of a dielectric multilayer film formed on a surface opposite to the semiconductor layer.

The electrodes of these light emitting elements 105 are flip-chip mounted on the conductive wiring 102 on the surface of the support member with the bonding member 103 interposed between the electrodes and the conductive wiring as illustrated in FIG. 2, and a surface substantially perpendicular to a surface on which the electrodes are formed, i.e., a light-transmissive sapphire substrate lateral surface, is set to be a light extraction surface. The light emitting element 105 is disposed so as to straddle the two (positive and negative) conductive wirings 102 electrically separated from each other, and is bonded by the bonding member 103. Examples of the method of mounting the light emitting element 105 include a mounting method using a bump, as well as a mounting method using a solder paste.

For the light emitting element, a compact packaged product can also be used.

Underfill Material 106

The underfill material 106 is formed between the light emitting element 105 and the support member 101. The underfill material 106 may contain a filler or a pigment for the purpose of approximating the coefficient of thermal expansion of the underfill material to the coefficient of thermal expansion of the light emitting element, and the purpose of reduction in scattering and reflecting the light from the light emitting element 105 by the support member 101.

The material of the underfill material 106 is sufficient as long as it is less likely to be deteriorated by the light from the light emitting element. There can be used, for example, epoxy resin, silicone resin, modified silicone resin, a urethane resin, an oxetane resin, acrylic resin, polycarbonate resin, and a polyimide resin.

When the filler or pigment contained in the underfill material 106 is a filler or pigment that absorbs light of the emission wavelength, light becomes much less likely to be reflected, so that scattering of light can be reduced.

An inorganic compound is preferably used for the light absorbing material to reduce deterioration caused by light.

Here, the reflectivity of the filler is preferably 50% or less, more preferably 40% or less with respect to the emission wavelength of light.

The particle size of the filler is preferably 1 nm or more and 10 μm or less. With the particle size of the filler in this range, the resin flowability of the underfill material becomes good, thereby enabling smoothly covering of even a narrow gap. The particle size of the filler is preferably 100 nm or more and 5 μm or less, more preferably 200 nm or more and 2 μm or less. The shape of particles of the filler may be spherical or scale-shaped.

When the underfill material does not have transmissivity, it is preferable that the lateral surfaces of the light emitting element is not covered with the underfill material by appropriately selecting and adjusting a disposition location and the material of the underfill. This is to enable the lateral surfaces of the light emitting element to securely serve as light extraction surfaces.

Covering Member 108

The covering member in the present embodiments is a member that is disposed on the support member to cover the light emitting element so that the light emitting element is protected from an external environment and the light output from the light emitting element is optically controlled.

Examples of the material for the covering member 108 include light-transmissive resins such as an epoxy resin, a silicone resin and a mixed resin of an epoxy resin and a silicone resin; and glass. Especially, the silicone resin is preferably selected in consideration of light resistance and ease of molding.

The top of the covering member 108 is preferably at a height of 2 mm or less from the upper surface of the base 120. Thereby, the optical distance to the irradiation surface can be reduced.

Further, in the covering member 108, the height H viewed from a lateral surface where the width W appears the smallest as illustrated in FIG. 2 is preferably 0.5 times or less the width. Thereby, wide light distribution can be obtained as compared with the case in which the height is higher than 0.5 times the width.

The light-transmissive rein can contain a wavelength conversion material that absorbs the light from the light emitting element and emits light of a wavelength different from the wavelength of the output light from the light emitting element, and a diffusing agent that diffuses the light from the light emitting element. A coloring agent can also be contained in accordance with the emission color of the light emitting element.

It is preferable that the covering member 108 do not have light diffuseness from the viewpoint of reducing the light intensity directly above the light emitting element. However, a minimal light diffusing agent that is required to give thixotropy necessary for molding may be added to the covering member.

The covering member 108 can be formed so as to cover the light emitting element by compression molding or injection molding. In addition, the viscosity of the material for the covering member 108 is optimized for dropping or drawing on the light emitting element 105, so that the shapes illustrated in the drawings can be formed by the surface tension of the material itself.

When the dropping or drawing method is used, a mold is not required, thereby enabling formation of the covering member by a simpler method. As the method of adjusting the viscosity of the material for the covering member according to such a forming method, the fluorescent material and the diffusing agent that are described above can also be utilized other than utilizing the original viscosity of the material.

Fluorescent Material

As the fluorescent material, there can be used, for example, a nitride fluorescent material and an oxynitride fluorescent material that are mainly activated by lanthanoids such as Eu and Ce. Specifically, the fluorescent material is preferably at least one selected from the materials described in (D1) to (D3) into which the materials are roughly categorized.

(D1) Fluorescent materials, such as alkaline earth halogen apatite, alkaline earth metal halogen borate, alkaline earth metal aluminate, alkaline earth metal sulfide, alkaline earth metal thiogallate, alkaline earth metal silicon nitride and germanate, which are mainly activated by lanthanoids such as Eu and transition metal elements such as Mn.

(D2) Fluorescent materials, such as rare earth aluminate, rare earth silicate, and alkaline earth metal rare earth silicate, which are mainly activated by lanthanoids such as Ce.

(D3) Fluorescent materials, such as an organic or organic complex, which are mainly activated by lanthanoids such as Eu.

Especially, an yttrium aluminum garnet (YAG) based fluorescent material is preferable, which is a rare earth aluminate fluorescent material mainly activated by lanthanoids such as Ce in (D2) described above. The YAG based fluorescent material is represented by the following composition formulate (D21) to (D24), for example.

$$Y_3Al_5O_{12}:Ce \tag{D21}$$

$$(Y_{0.8}Gd_{0.2})_3Al_5O_{12}:Ce \tag{D22}$$

$$Y_3(Al_{0.8}Ga_{0.2})_5O_{12}:Ce \tag{D23}$$

$$(Y,Gd)_3(Al,Ga)_5O_{12}:Ce \tag{D24}$$

Alternatively, a part or all of Y may be substituted with Tb, Lu, or the like, for example. Specifically, the composition formula may be $Tb_3Al_5O_{12}$: Ce, $Lu_3Al_5O_{12}$: Ce, and the like. A fluorescent material can also be used, which is other than the above-described fluorescent materials and has a similar performance, action and effect as those of the above-described fluorescent materials.

The covering member contains a wavelength conversion material to give a light emitting device capable of outputting light having a desired wavelength.

Hereinafter, examples according to an embodiment of the present invention are described in detail. It is indisputable that the embodiment of the present invention is not limited only to the examples below.

Example 1

FIGS. 1 and 2 illustrate a schematic top view and a schematic sectional view of a light emitting device of Example 1.

On a support member 101 of the present example, a light emitting element 105 is flip-chip mounted so as to straddle a pair of positive and negative conductive wirings 102a and 102b provided on the support member with a bonding member 103 interposed between the light emitting element and the pair of conductive wiring lines, as illustrated in FIG. 1. A light reflecting layer 104 is formed in a region of a conductive wiring 102 which does not require electrical connection. A light-transmissive underfill material 106 is formed under and on a lateral surface of the light emitting element 105, and a covering member 108 is formed so as to directly cover the underfill material 106.

In the present example, a glass epoxy base material is used for the support member 101, a Cu material having a thickness of 35 µm is used for the conductive wiring 102, and an epoxy white solder resist is used for the light reflecting layer 104.

The light emitting element 105 can employ a nitride blue LED which is a substantially square having each side of 600 µm and has a thickness of 150 µm, and a dielectric multilayer film is formed on an upper surface thereof. The unclean material 106 can employ a silicone resin. The covering member 108 can employ a silicone resin and is formed into a substantial dome shape.

Although it is preferable that the covering member 108 in the present example do not contain light diffuseness, a silica based nanofiller is added to give thixotropy to the covering member.

The ratios of the areas of the conductive wiring 102 and a groove portion 130 that are in contact with the covering member 108 are about 90% and about 10%, respectively, relative to the bottom area of the covering member 108. The reflectivity of the conductive wiring is about 50% for the light emission wavelength of the light emitting element, and the reflectivity of the groove portion is about 80% for the emission wavelength of light from the light emitting element. The average reflectivity is thus about 53% in consideration of the ratio of the areas in the region covered with the covering member 108. On the other hand, the reflectivity of the light reflecting layer 104 is about 80% for the emission wavelength of light from the light emitting element.

Example 2

Figure 8:
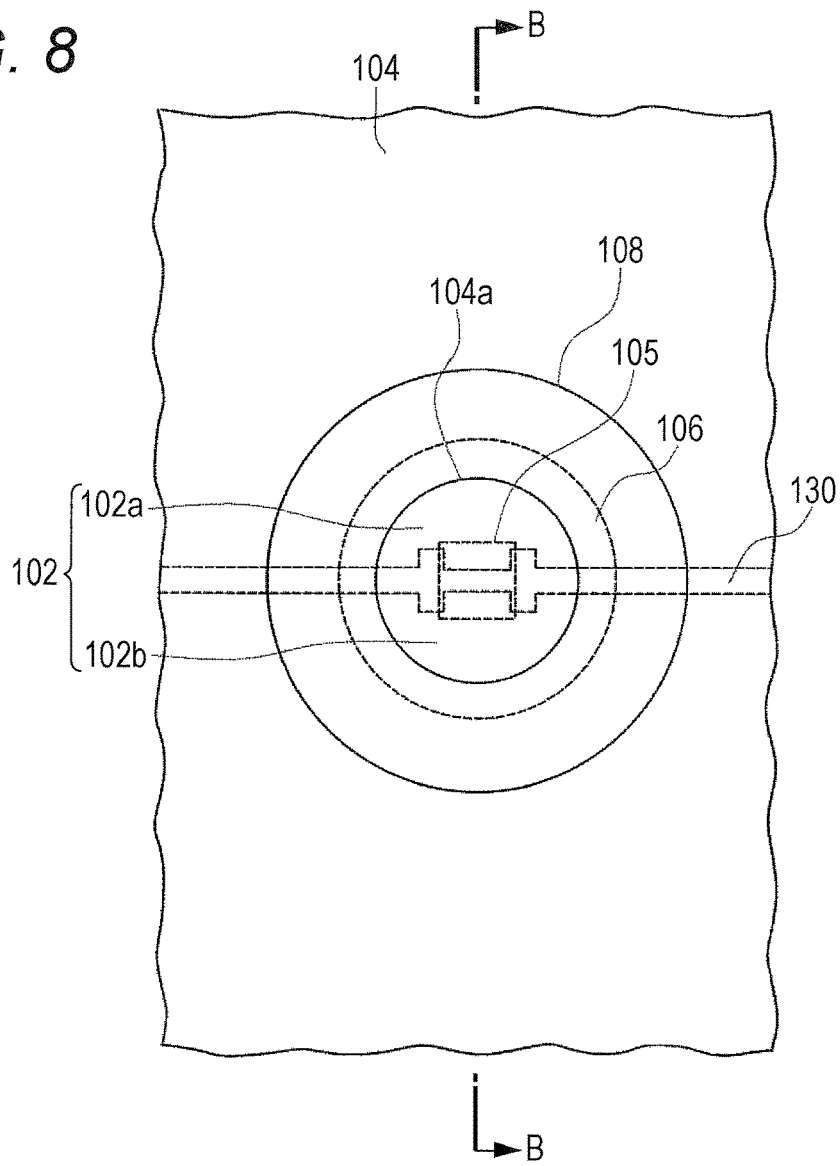
FIG. 8 is a schematic top view illustrating a light emitting device according to Example 2.
Figure 9:
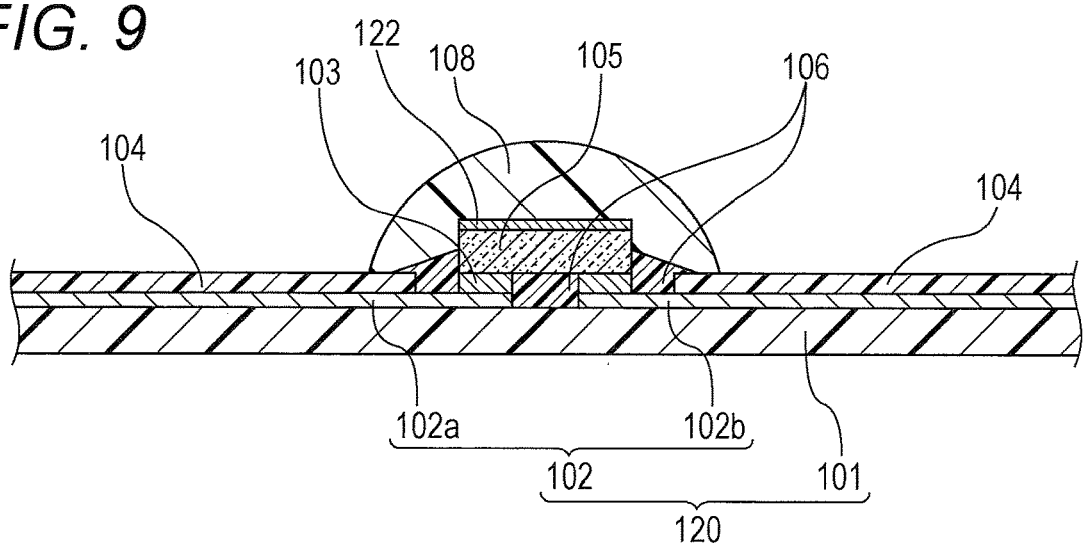
FIG. 9 is a schematic sectional view illustrating the light emitting device according to Example 2.

FIG. 8 illustrates a schematic top view of a light emitting device of Example 2, and FIG. 9 illustrates a schematic sectional view taken along the line B-B in FIG. 8. In the light emitting device of Example 2, the ratio of the area of the conductive wiring 102 in contact with the covering member 108 is changed from the ratio in the light emitting device of Example 1. In the light emitting device of Example 2, the light reflecting layer 104 is also disposed under the covering member 108, and the conductive wiring is exposed from the light reflecting layer 104 only in the vicinity of the light emitting element. An opening 104a of the light reflecting layer is positioned under the covering member 108.

In the light emitting device of Example 2, the ratios of the areas of the conductive wiring, the light reflecting layer 104, and the groove portion 130 that are in contact with the covering member 108 are 23%, 72%, and 5%, respectively, relative to the bottom area of the covering member 108. The reflectivity of the conductive wiring is 50% for the emission wavelength of the light emitting element, and the reflectivity of the light reflecting layer and the groove portion is 80% for the emission wavelength of the light emitting element. The average reflectivity is thus 73% in consideration of the ratio of the areas in the region covered with the covering member 108.

Figure 10:
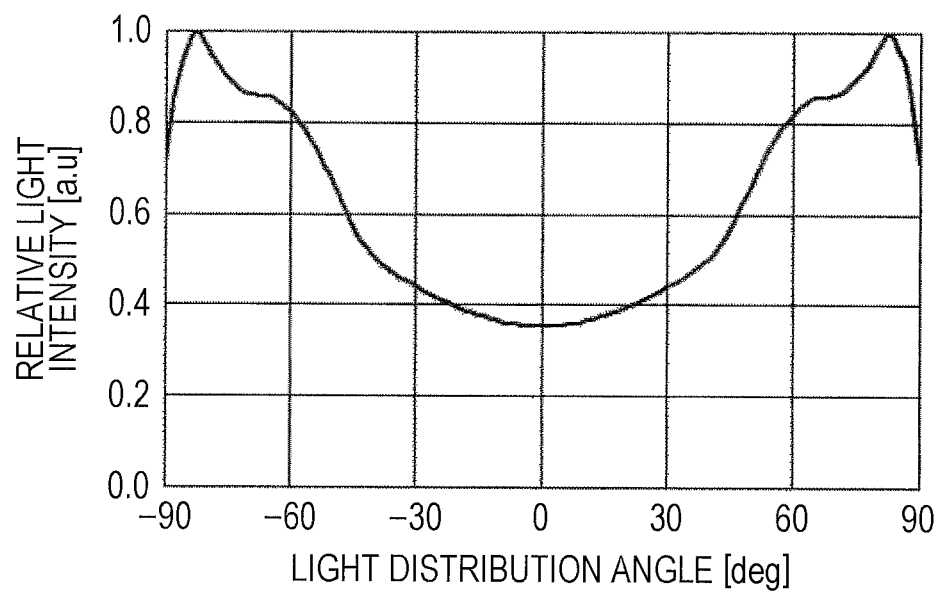
FIG. 10 is a graph showing light distribution characteristic of a light emitting device according to Example 1.
Figure 11:
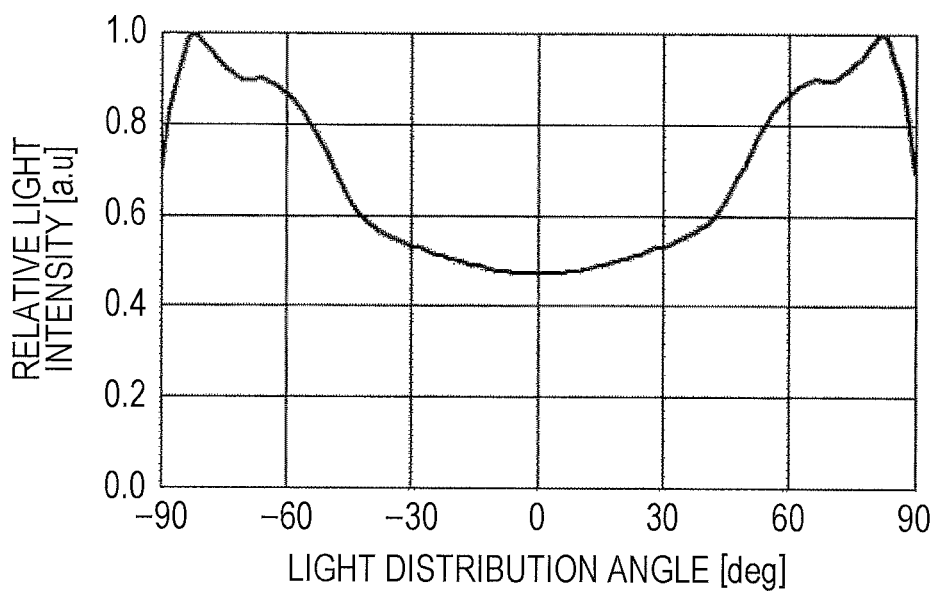
FIG. 11 is a graph showing light distribution characteristic of the light emitting device according to Example 2.

FIG. 10 illustrates a light distribution characteristic graph of the light emitting device of Example 1, and FIG. 11 illustrates a light distribution characteristic graph of the light emitting device of Example 2. In the light emitting device of Example 2, the relative light intensity is reduced only to about 0.47 in a region at a light distribution angle of 0°, whereas in Example 1 in which the average reflectivity is set to be 60% or less in the region covered with the covering member 108, the relative light intensity is reduced to about 0.35 in a region where the relative light intensity becomes low so that it is understood that the light intensity in an upper surface direction can be adequately decreased. That is, the reflectivity on the surface of a part in contact with the covering member can be adjusted to obtain desired light distribution characteristics.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
    a base comprising:
        a support having a support surface; and
        a conductive wiring provided on the support surface;
    a light emitting element mounted on the conductive wiring and the support surface to be electrically connected to the conductive wiring, the light emitting element comprising:
        a semiconductor layer provided on the conductive wiring and the support surface; and
        a sapphire substrate provided on the semiconductor layer opposite to the support surface;
    a reflecting film provided on the sapphire substrate to sandwich the sapphire substrate between the semiconductor layer and the reflecting film;
    a light-transmissive covering member provided on the support surface to cover the light emitting element, a height of the light-transmissive covering member viewed in a direction in which a width of the light-transmissive covering member appears smallest being 0.5 times or less of the width of the light-transmissive covering member; and
    a light reflecting layer provided on a first region of the base such that a first reflectivity in the first region of the base being higher than a second reflectivity in a second region of the base, the second region overlapping with the light emitting element and being surrounded by the first region as viewed in the height direction.

2. The light emitting device according to claim 1, wherein the conductive wiring has an outermost surface containing Cu.

3. The light emitting device according to claim 1, wherein the light-transmissive covering member is in direct contact with the base.

4. The light emitting device according to claim 1, wherein a height between the conductive wiring and the top of the light-transmissive covering member is 2 mm or less in the height direction.

5. The light emitting device according to claim 1, wherein the covering member includes a light absorbing portion, which covers at least a portion of the covered region on the base.

6. The light emitting device according to claim 1, wherein the covering member includes a light absorbing portion on the bottom of the covering member.

7. The light emitting device according to claim 1, wherein the reflecting film is a dielectric multilayer film.

8. The light emitting device according to claim 1, further comprising:
    additional light emitting elements mounted on the base.

* * * * *